US005506573A

United States Patent [19]
Ewing et al.

[11] Patent Number: 5,506,573
[45] Date of Patent: Apr. 9, 1996

[54] REMOTE SENSOR AND METHOD FOR DETECTING THE ON/OFF STATUS OF AN AUTOMATICALLY CONTROLLED APPLIANCE

[75] Inventors: Carrell W. Ewing, Palo Alto; Andrew J. Cleveland, San Martin, both of Calif.

[73] Assignee: Server Technology, Inc., Sunnyvale, Calif.

[21] Appl. No.: 263,035

[22] Filed: Jun. 21, 1994

Related U.S. Application Data

[63] Continuation-in-part of Ser. No. 61,197, May 13, 1993, abandoned.

[51] Int. Cl.⁶ .................................................. G08B 21/00
[52] U.S. Cl. ......................... 340/644; 340/654; 340/635; 340/652; 324/415
[58] Field of Search ............................... 340/644, 654, 340/635, 652, 657, 658; 324/415

[56] References Cited

U.S. PATENT DOCUMENTS

| | | | |
|---|---|---|---|
| 3,815,110 | 6/1974 | Davidson | 340/654 |
| 4,864,285 | 9/1989 | Rodden | 340/644 |
| 5,136,280 | 8/1992 | Heggli | 340/635 |

Primary Examiner—Brent A. Swarthout
Assistant Examiner—Julie B. Lieu
Attorney, Agent, or Firm—Richard B. Main

[57] ABSTRACT

A method for sensing the on/off status condition of a power switch in an appliance includes applying a series of alternating current (AC) voltage pulses to an appliance with an on/off switch that are synchronized to a source of AC power, sensing the presence of any series of AC current pulses that result if said appliance switch is closed, analyzing any AC current pulses detected in the step of sensing to determine if they resulted from the application of the AC voltage in the step of applying, and outputting an on/off status indication for the appliance switch.

5 Claims, 2 Drawing Sheets

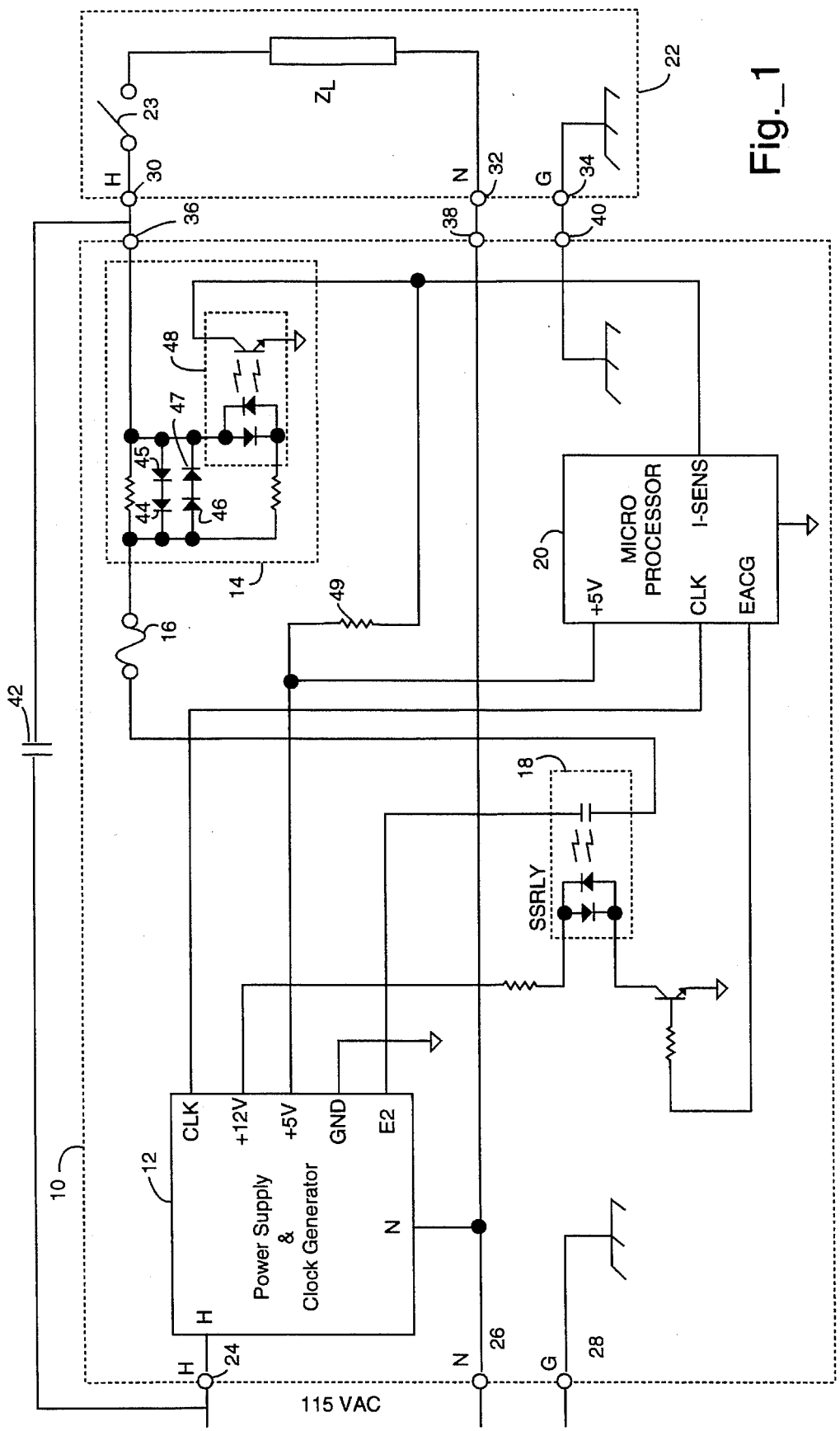
Fig._1

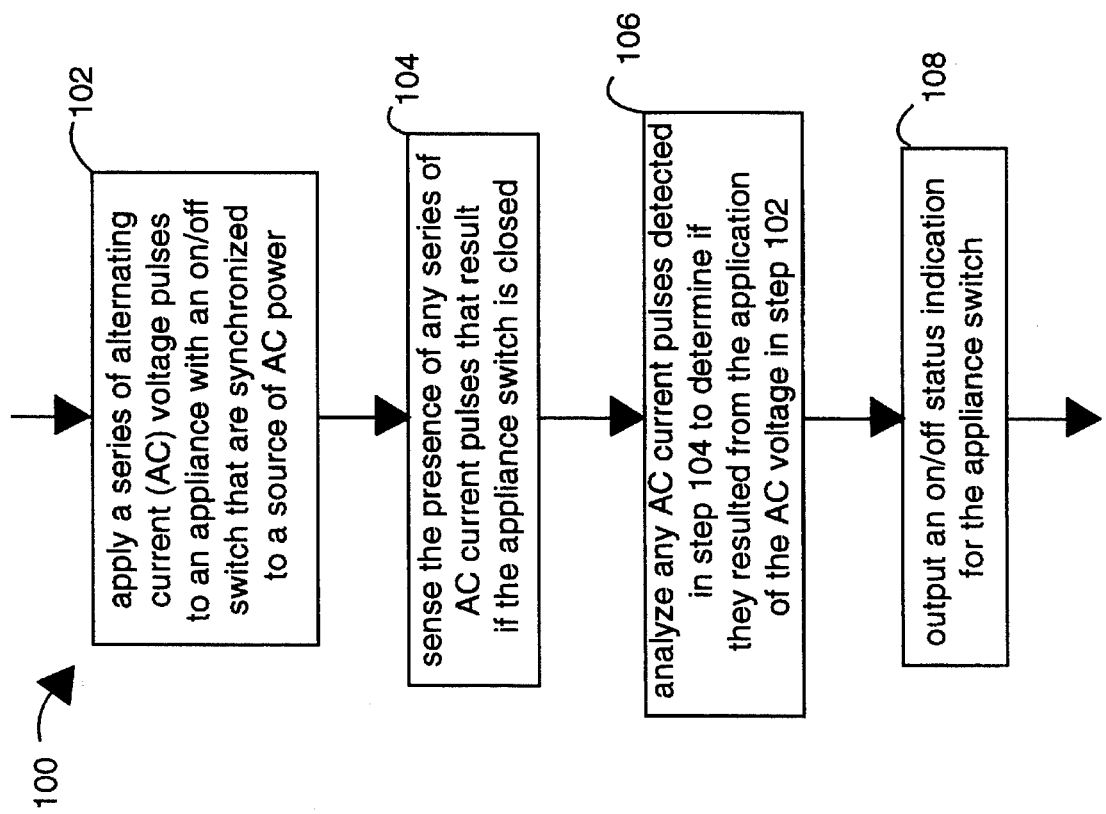
Fig._2

REMOTE SENSOR AND METHOD FOR DETECTING THE ON/OFF STATUS OF AN AUTOMATICALLY CONTROLLED APPLIANCE

RELATED APPLICATIONS

This application is a continuation-in-part of two earlier applications filed in the USPTO, the latter is Ser. No. 08/061,197, and was filed May 13, 1993, and the former was filed Nov. 16, 1991, as PCT application PCT/US91/08543, and which was entered into the national stage of prosecution in the USPTO Mar. 5, 1993. Such prior application is incorporated herein by reference.

BACKGROUND OF THE INVENTION

1. Field of the Invention

The invention relates generally to automatic power control and more particularly to remote control methods and devices to operate computer systems.

2. Description Of the Prior Art

Appliances, such as computers and their printers, can perform useful functions when left unattended at remote sites. It therefore often becomes necessary to remotely control the power on/off and functioning of such appliances, e.g., by phone. But such control can be confused by the presence of manual, local on/off switches on the appliances themselves or override buttons provided on the remote control device. The confusion arises because the remote control is conventionally not able to sense the operation or status of such manual or override controls.

Various kinds of remote controlled power switches have appeared on the personal computer (PC) after market. One such device is a telephone activated power control unit marketed in the United States as POWER-ON by Server Technology (Santa Clara, Calif.). It allows a PC, equipped with a standard telephone line and modem, to power-on/off a remote appliance. Using bundled communications software the PC can operate the remote PC, run its programs, transfer data files, and use a printer.

U.S. Pat. No. 4,647,721, issued to Busam, et al., describes a telephone activated power controller having an electrical power inlet and a number of outlets for various appliances, such as a computer. A detector senses a ring condition on a standard telephone line and goes off-hook while connecting inlet power to its outlets. A remote control unit allows the computer to keep the power on after hang-up (on-hook) or manual power-off. A status sensor can tell the computer if the device has been turned on manually or remotely. An inhibit circuit can prevent the device from responding to a telephone ring or off-hook condition. The controller also has surge protection on the power outlets.

A device called POWERKEY is marketed for use with the Apple Macintosh PC. This device reportedly can turn a system on and off, and it can execute keyboard macros at present times, for applications such as unattended backups or telecommunications file transfers. A "cdev" program enables daily, weekday, weekly, monthly, and unique events to be scheduled. The Macintosh can be turned on with a phone call using a POWERKEY remote device. Software such as TIMBUKTU REMOTE or CARBON COPY MAC can allow the computer to be operated from a remote location as if the operator were actually in front of the computer, and not one connected to it.

Another device called PHONEBOOT is sold by Cybex Corporation (Huntsville, Ala.) allows a user to boot computers, peripherals, and other appliances from a remote location using a telephone, while providing built-in password protection. The device has six 120 VAC outlets, surge protection, a phone plug, a modem plug, and a power cord. It works with Hayes compatible modems and TOUCH TONE (DTMF) telephones. There are three modes of operation: remote enable, local on, and master off. In remote enable, the device monitors an incoming phone line for a call. After eight rings, the call is answered and the caller is given a prompt tone and a three digit security code must be entered. The code can come in via TOUCH TONE phone or by modem. If the code is accepted, the power outlets are turned on. If a modem is attached, it must provide an answer back tone to the caller and establish a communications channel. Power is left on for 18 minutes after hanging up. Yet another device is the TELESWITCH by EKD (Selden, N.Y.) which uses a four digit security code, a local ring circuit for a modem after power-up, and automatic modem transfer to phone line after modem answers local ring. It is advertised to work with host/remote software such as pcANYWHERE (Dynamic Microprocessor Associates). The device allows a user to disconnect during a call to save on phone charges while leaving the computer on. A later call-back can shut the power down.

Other units with more-or-less the same features described above are the "Remote PowerOnOff Control" by L-Tech Associates (Oak Lawn, Ill.), the INTELE-STRIP 800 from ALM (California), and the Lead Operated Relay (LOR-II) GS-SW701A by Black Box Catalog.

The prior art does not provide a device or method for the sensing of whether an appliance that is off can be automatically turned-on.

SUMMARY OF THE PRESENT INVENTION

It is therefore an object of the present invention to provide a system and method for providing power switch status detection in appliances at geographically distant locations.

Briefly, a method embodiment of the present invention for sensing the on/off status condition of a power switch in an appliance includes applying a series of alternating current (AC) voltage pulses to an appliance with an on/off switch that are synchronized to a source of AC power, sensing the presence of any series of AC current pulses that result if said appliance switch is closed, analyzing any AC current pulses detected in the step of sensing to determine if they resulted from the application of the AC voltage in the step of applying, and outputting an on/off status indication for the appliance switch.

An advantage of the present invention is that a device is provided which can sense the status of an on/off switch in an appliance.

Another advantage of the present invention is that a method is provided for sensing the status of an on/off switch in an appliance.

A further advantage of the present invention is that a device is provided that can communicate power switch status to an automatic remote control system.

These and many other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic diagram of an appliance power switch status detection device embodiment of the present invention; and FIG. 2 is a flowchart of a method of appliance power switch status detection, according to the present invention.

DETAILED DESCRIPTION OF THE PREFERRED EMBODIMENTS

FIG. 1 illustrates an appliance power switch status detection device embodiment of the present invention, referred to herein by the general reference numeral 10. Device 10 comprises a power supply and clock generator 12, a current sensor 14, a fuse 16, a solid-state relay 18 and a microprocessor 20. An appliance 22 has a power on/off switch 23 that may be internal or external to the appliance. The switch 23 may also comprise both internal and external switches in series. The incoming alternating current (AC) line power is applied to the device 10 at a hot (H) terminal 24, a neutral (N) terminal 26 and a ground (G) terminal 28. The appliance 22 has its incoming AC line power applied to a hot (H) terminal 30, a neutral (N) terminal 32 and a ground (G) terminal 34, which are respectively connected to a hot (H) terminal 36, a neutral (N) terminal 38 and a ground (G) terminal 40. A switch 42 represents an automatic remote control switch that, because of its position in the incoming AC line to the appliance 22, will be able to turn power on/off to the appliance 22 if the switch 23 is actually closed.

In operation, the device 10 senses if switch 23 is closed or open by converting an AC current which flows through the series circuit of solid-state relay 18, fuse 16 and current sensor 14 to H25 terminal 36 and therefore appliance 22. If the switch 23 is open, no such current can flow.

The current sensor 14 includes a pair of diodes 44 and 45 connected in series, then back-to-back, with another pair of series-connected diodes 46 and 47. Such a connection limits the voltage that can develop across them if an AC current is flowing to 1.7 volts peak-to-peak. An opto-isolator 48 is connected to sense any voltage developed across the diodes 44–47 and provides a controlled common-emitter switched voltage to the microprocessor 20. If a current is flowing because switch 23 is closed, the opto-isolator will conduct current through resistor 49. The microprocessor will read this as a LOW.

The power supply and clock generator 12 provides a five volt pulse clock (CLK) to the microprocessor 20 at each zero-crossing of the incoming AC power line voltage across the H-terminal 24 and the N-terminal 26. A slightly delayed version of the clock is output by the microprocessor 20 to control the solid-state relay 18. An output (E2) of the power supply and clock generator 12 provides a reduced voltage AC sine wave that is approximately seventy volts peak-to-peak. The solid-state relay 18 therefore gates through the seventy volt AC waveform twice each cycle such that alternating pulses of +70 volts and −70 volts are sent through fuse 16, current sensor 14 and switch 23. If a current flows because the switch 23 is closed, a characteristic pulse synchronized to the CLK signal will appear as an output from the opto-isolator 48. If the switch 23 is open, such pulses will not appear.

The microprocessor 20 analyzes and stores its determination of whether the switch 23 is closed. Such data is thereafter useful to control the switch 42. The microprocessor 20 can alternatively be connected to control the switch 42, and be connected to a modem to communicate the status of the switch 23 to remote controllers.

FIG. 2 shows a method of appliance power switch status detection, referred to herein by the general reference numeral 100. The method 100 comprises a step 102 applying a series of alternating current (AC) voltage pulses to an appliance with an on/off switch that are synchronized to a source of AC power. A step 104 senses the presence of any series of AC current pulses that result if the appliance switch is closed. A step 106 analyzes any AC current pulses detected in step 104 to determine if they resulted from the application of the AC voltage in step 102. A step 108 outputs an on/off status indication for the appliance switch. Method 100 does not result in the turning-on and the operation of the appliance during steps 102 or 104, and is therefore unobtrusive.

Although the present invention has been described in terms of the present embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for externally sensing the on/off status condition of a load power switch in an appliance from an AC-Only power source connection of the appliance, comprising the steps of:

applying a positive voltage pulse and a negative voltage pulse each delayed from a zero crossing of an AC power source to an external power connection for said AC Dower source of an appliance having an internal load power switch with on and off conditions;

sensing the presence of any current flowing through said external power connection to said appliance;

analyzing said any current flowing for its relationship to said positive and negative pulses; and outputting an "on" status indication for said internal load power switch when said any current is determined to be related to said positive and negative pulses, and outputting an "off" status indication otherwise.

2. An appliance power switch status detection device, comprising:

a set of AC power supply terminals providing for the only connection of AC input power to an external AC power connection of an appliance with an internal load power switch that is not directly accessible through said external AC power connection because of an internal connection of an internal appliance load;

synchronized pulse generation means connected to the AC power supply terminals for applying a positive voltage pulse and a negative voltage pulse each delayed from a zero-crossing of an AC power source to AC power supply terminals;

a diode and resistor combination connected in series between the AC power supply terminals and the synchronized pulse generation means for converting a current flowing through said internal power switch, said internal appliance load and said external AC power connection into a voltage; and a microprocessor connected to both the synchronized pulse generation means and the the diode and resistor combination and an opto-isolator for analyzing said current flowing for its relationship to said positive and negative pulses, and for outputting an "on" status indication for said internal load power switch when said current flowing is determined to be related to said positive and negative pulses, and outputting an "off" status indication otherwise.

3. The device of claim 2, wherein:

the AC power supply terminals comprise hot, neutral and ground connections for powering said appliance;

the synchronized pulse generation means includes a clock generator with an output that coincides with each zero-crossing of said AC power source;

the resistor and diode combination comprises back-to-back connected diodes in parallel and connected to provide a limited voltage input to said opto-isolator; and the microprocessor is connected to control the timing of the synchronized pulse generation means according to a delay from a connection to said zero-crossing output.

4. An appliance power switch status detection device (10), comprising:

AC power input terminals (24, 26, 28) providing for connection to a source of AC utility power;

a power supply and clock generator (12) connected to the AC power input terminals and providing for a zero-crossing clock that signals the zero-crossing event of said AC utility power, a DC power supply and a reduced-voltage AC power supply;

a microprocessor (20) connected to receive said zero-crossing clock and an appliance current sense signal and connected to output a control signal delayed from each occurrence of said zero-crossing clock;

a solid-state relay (18) connected to control an appliance signal voltage from said reduced-voltage AC power supply in response to a connection to said microprocessor control signal output providing for a positive voltage pulse and a negative voltage pulse;

AC power output terminals (36, 38, 40) providing for a through connection of AC power from the AC power input terminals to a connected appliance (22) having a load ($Z_L$) in series with a on/off switch (23) and an automatic remote control switch (42); and a current sensor (14) connected in series with one of said AC power output terminals and said positive and negative voltage pulses provided by the solid-state relay and providing for the measurement of current through said on/off switch (23) and having an output connected to provide said appliance current sense signal to the microprocessor; wherein the he microprocessor analyzes and stores its determination of whether said on/off switch (23) is closed, and wherein such determination is useful to control said automatic remote control switch (42).

5. The device (10) of claim 4, wherein:

the microprocessor (20) is connected to control said automatic remote control switch (42) and provides for a connection to a modem for communicating said determination of the on/off status of said on/off switch (23) to remote locations.

* * * * *